United States Patent
Kasumi et al.

(10) Patent No.: US 8,616,874 B2
(45) Date of Patent: Dec. 31, 2013

(54) PATTERN TRANSFERRING APPARATUS AND PATTERN TRANSFERRING METHOD

(75) Inventors: Kazuyuki Kasumi, Utsunomiya (JP); Hirohisa Ota, Kawagoe (JP); Eigo Kawakami, Utsunomiya (JP); Takashi Nakamura, Tokyo (JP); Toshinobu Tokita, Yokohama (JP)

(73) Assignee: Canon Kabushiki Kaisha (JP)

( * ) Notice: Subject to any disclaimer, the term of this patent is extended or adjusted under 35 U.S.C. 154(b) by 1798 days.

(21) Appl. No.: 11/364,694

(22) Filed: Feb. 27, 2006

(65) Prior Publication Data

US 2006/0192928 A1    Aug. 31, 2006

(30) Foreign Application Priority Data

Feb. 28, 2005    (JP) ................... 2005-055096

(51) Int. Cl.
    *A01J 21/00*    (2006.01)
(52) U.S. Cl.
    USPC ........................................... 425/400
(58) Field of Classification Search
    USPC ................... 355/30, 53, 72; 425/400
    See application file for complete search history.

(56) References Cited

U.S. PATENT DOCUMENTS

| | | | |
|---|---|---|---|
| 6,309,580 B1 | 10/2001 | Chou | |
| 2003/0103195 A1 | 6/2003 | Tsuruma et al. | |
| 2005/0212182 A1* | 9/2005 | Yokoyama et al. | 264/496 |
| 2005/0227153 A1 | 10/2005 | Tsuruma et al. | |
| 2006/0172031 A1* | 8/2006 | Babbs et al. | 425/385 |

FOREIGN PATENT DOCUMENTS

| | | | |
|---|---|---|---|
| EP | 1 072 954 A3 | | 5/2002 |
| JP | 2-113456 A | | 4/1990 |
| JP | 2-292029 A | | 12/1990 |
| JP | 8-207159 A | | 8/1996 |
| JP | 2001-068411 A | | 3/2001 |
| JP | 2003-156834 A | | 5/2003 |
| JP | 2004-017409 A | | 1/2004 |
| WO | WO2004/010452 | * | 1/2004 |
| WO | 2005/006076 A2 | | 1/2005 |
| WO | 2006/083518 A2 | | 8/2006 |

OTHER PUBLICATIONS

Stephen Y. Chou et al. "Imprint Lithography with 25-Nanometer Resolution", Science, vol. 272, Apr. 5, 1996, pp. 85-87.

* cited by examiner

*Primary Examiner* — Larry Thrower
(74) *Attorney, Agent, or Firm* — Rossi, Kimms & McDowell LLP

(57) ABSTRACT

A pattern transferring apparatus is disclosed which can prevent damage to a transferred pattern and realize fast mold release regardless of the type of resist. The pattern transferring apparatus transfers a pattern formed on a mold to an object by bringing the mold into contact with the apparatus has a deformer which causes deformation in the mold for releasing the mold from the object. The apparatus transfers a pattern formed on a mold to a photo-curing resin by bringing the mold into contact with the photo-curing resin and applying light thereto to cure the photo-curing resin. The apparatus has an optical system which applies light at an irradiation light intensity to a non-transfer area other than a transfer area where the pattern is to be transferred in the photo-curing resin, the intensity being different from an irradiation light intensity of light applied to the transfer area.

6 Claims, 12 Drawing Sheets

MOLD RELEASE
STARTING POINT

PATTERN TRANSFERRING APPARATUS AND PATTERN TRANSFERRING METHOD

BACKGROUND OF THE INVENTION

The present invention relates to a so-called nanoimprint lithography apparatus which transfers a pattern formed on a mold to an object such as a resin material by bringing the mold into contact with the object.

A so-called nanoimprint lithography technique has been proposed for manufacturing various devices having fine patterns including semiconductor chips such as ICs and LSIs, display devices such as liquid crystal panels, detecting devices such as magnetic heads, image-pickup devices such as CCDs, and MEMS (Micro Electro-Mechanical Systems)

The nanoimprint lithography involves pushing a mold (also referred to as an original plate or a template) having a fine pattern formed thereon onto a wafer coated with a resin material (a resist) to transfer the pattern to the resist. (see S. Y. Chou, et al., Science, vol. 272, p. 85-87, 5 Apr. 1996).

Propositions of the nanoimprint lithography include a transfer method in which polymer used as a resist is heated to a glass transition temperature or higher to increase the fluidity to facilitate the flow of the resist at the time of transfer (a heat cycle method), and a transfer method in which an ultraviolet-curing resin (a UV-curing resin) is used as a resist and is irradiated with light while it is in contact with a transparent mold to achieve curing (called a photo-curing method or a UV-curing method). The photo-curing method is often used in manufacturing the semiconductor device.

FIGS. 15(1) to 15(3) show a transfer process in the photo-curing method.

A first step (1) is a stamping step. A mold M made of a material (for example, quartz) which passes ultraviolet light is pushed onto a resist UVR made of UV-curing resin coating a substrate (a wafer) W. This causes the UV-curing resin to flow along a pattern formed on the mold.

A second step (2) is a curing step. With the mold M pushed onto the resist UVR on the substrate W, ultraviolet light UV is applied thereto. As a result, the resist is cured in the same shape as the pattern on the mold M.

A third step (3) is a mold release step. The mold M is released from the cured resist UVR. After the mold release, the resist UVR having the shape of the pattern is left on the substrate W. In this manner, the pattern is transferred to the substrate.

In manufacturing the semiconductor device, the above-mentioned transfer process is generally repeated on a single substrate to transfer a plurality of patterns all over the substrate.

RIE processing is performed to remove the base of the transferred resin (resist) pattern. The resulting pattern is equivalent to a resist pattern provided by transfer in a conventional photolithography apparatus. The subsequent steps are the same as those in a conventional LSI manufacturing process.

The stamping step and the curing step can be performed faster by speeding up the mechanical operation and applying illumination light with higher illuminance, respectively. However, the mold release step is not easily performed quicker simply by speeding up the mechanical operation since the fine pattern may be damaged by the friction between the mold and the cured resist. To address this, the mold is subjected to mold release coating to improve the mold release property (see U.S. Pat. No. 6,309,580).

The resist, however, is not always convenient for the mold release depending on the conditions of device manufacturing. Specifically, even when typical mold release coating is performed on the mold, the mold release property cannot be improved sufficiently in some types of resists.

BRIEF SUMMARY OF THE INVENTION

It is an object of the present invention to provide a pattern transfer ring apparatus and a transfer method which can prevent damage to a transferred pattern and realize fast mold release regardless of the type of resist.

According to an aspect, the present invention provides a pattern transferring apparatus which transfers a pattern formed on a mold to an object by bringing the mold into contact with the object. The pattern transferring apparatus has a deformer which causes deformation in the mold for releasing the mold from the object.

According to another aspect, the present invention provides a pattern transferring apparatus which transfers a pattern formed on a mold to a photo-curing resin by bringing the mold into contact with the photo-curing resin and applying light thereto to cure the photo-curing resin. The pattern transferring apparatus has an optical system which applies light at an irradiation light intensity to a non-transfer area other than a transfer area where the pattern is to be transferred in the photo-curing resin, the irradiation light intensity being different from an irradiation light intensity of light applied to the transfer area.

According to yet another aspect, the present invention provides a pattern transferring apparatus which transfers a pattern formed on a mold to an object by bringing the mold into contact with the object. The pattern transferring apparatus has an actuator which generates force in the mold in a direction in which the mold is released from the object.

According to a further aspect, the present invention provides a method of transferring a mold pattern, having the steps of transferring a pattern formed on a mold to an object by bringing the mold into contact with the object, and causing deformation in the mold for releasing the mold from the object.

According to a still further aspect, the present invention provides a method of transferring a mold pattern, having the steps of transferring a pattern formed on a mold to a photo-curing resin by bringing the mold into contact with the photo-curing resin and applying light thereto to cure the photo-curing resin, and applying light at an irradiation light intensity to a non-transfer area other than a transfer area where the pattern is to be transferred in the photo-curing resin, the irradiation light intensity being different from an irradiation light intensity of light applied to the transfer area.

According to a yet further aspect, the present invention provides a method of transferring a mold pattern, having the steps of transferring a pattern formed on a mold to an object by bringing the mold into contact with the object, and driving an actuator which is provided for the mold and generates force in the mold in a direction in which the mold is released from the object.

Other objects and features of the present invention will become readily apparent from the following description of the preferred embodiments with reference to accompanying drawings.

DETAILED DESCRIPTION OF THE PREFERRED EMBODIMENTS

Preferred embodiments of the present invention will hereinafter be described with reference to the drawings.
(Embodiment 1)

Figure 1:
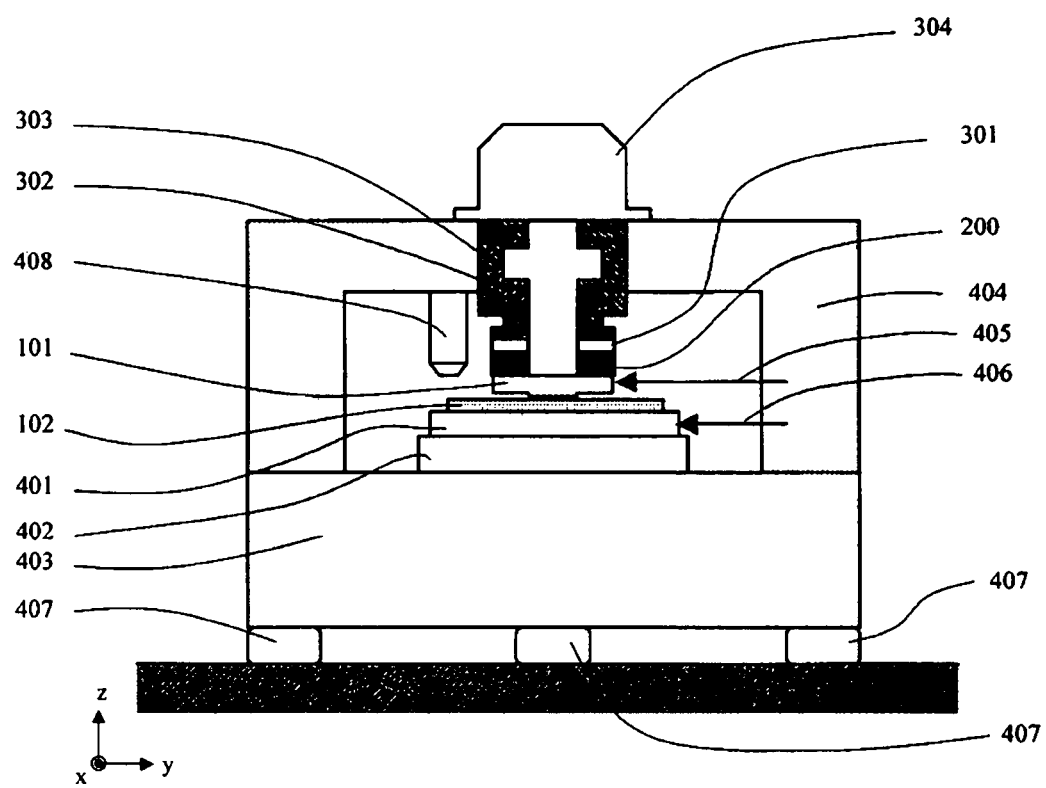
FIG. 1 is a schematic diagram showing the structure of a nanoimprint apparatus which is Embodiment 1 of the present invention.

FIG. 1 shows a UV-curing nanoimprint lithography apparatus (hereinafter referred to simply as a nanoimprint apparatus) serving as a pattern transferring apparatus which is Embodiment 1 of the present invention. The nanoimprint apparatus is of a step and repeat type in which a mold having a circuit pattern for a single or a plurality of chips of a semiconductor device formed thereon is successively transferred onto a resist made of UV-curing resin applied to a wafer.

In FIG. 1, reference numeral 101 shows a mold (also referred to as an original plate, a template or the like) made of a material which passes ultraviolet light, for example, quartz. A pattern corresponding to the abovementioned circuit pattern is formed three-dimensionally on the bottom of the mold 101. The area of the mold 101 that has the pattern formed thereon will hereinafter be referred to as a pattern area or a pattern surface.

Reference numeral 102 shows a wafer which is a substrate to be processed, and its surface is coated with a resist, not shown.

Reference numeral 200 shows a mold chuck for holding the mold 101 on the nanoimprint apparatus. The mold chuck 200 has an opening at the center to pass ultraviolet light for curing the resist. The mold chuck 200 will be described later in detail.

Reference numeral 301 shows a mold stage which controls the attitude of the mold 101 to place the bottom of the mold 101 in parallel with the surface of the wafer 102. The mold stage 301 also includes a mechanism for holding the mold 101 and the wafer 102 in parallel with each other when the mold 101 is pressed onto the wafer 102.

Reference numeral 302 shows a mold driver (a slider) which is movable vertically for pushing the mold 101 onto the wafer 102. Reference numeral 303 shows a Z guide which guides the driving direction of the mold driver 302. Reference numeral 304 shows an illumination optical system which has a light source for emitting ultraviolet light and a group of lenses to irradiate the mold surface (the wafer surface) with ultraviolet light having substantially uniform intensity distribution. Reference numeral 401 shows a wafer chuck for holding the wafer 102.

Reference numeral 402 shows a wafer stage which has the function of moving the wafer 102 in its in-plane direction to perform pattern transfer all over the wafer 102 and the function of controlling the attitude of the wafer 102.

Reference numeral 403 shows a platen (base) which holds the wafer stage 402 and a frame 404. Reference numeral 405 shows a first interferometer beam which is applied to the mold 101 for measuring the position and the attitude of the mold 101. Reference numeral 406 shows a second interferometer beam which is applied to the wafer 102 for measuring the position and the attitude of the wafer 102. The positions and the attitudes of the mold 101 and the wafer 102 can be measured by a laser interferometer with the first and second interferometer beams 405 and 406 in this manner to achieve relative positioning of them accurately.

Reference numeral 407 shows a vibration isolation stage which prevents vibrations of the apparatus due to disturbance vibrations from the floor on which the apparatus is disposed, which would otherwise cause reduced accuracy of the positioning.

Reference numeral 408 shows an alignment-scope for detecting an alignment mark provided on the wafer 102 to position the wafer 102 with respect to the mold 101 in performing pattern transfer.

Figure 2:
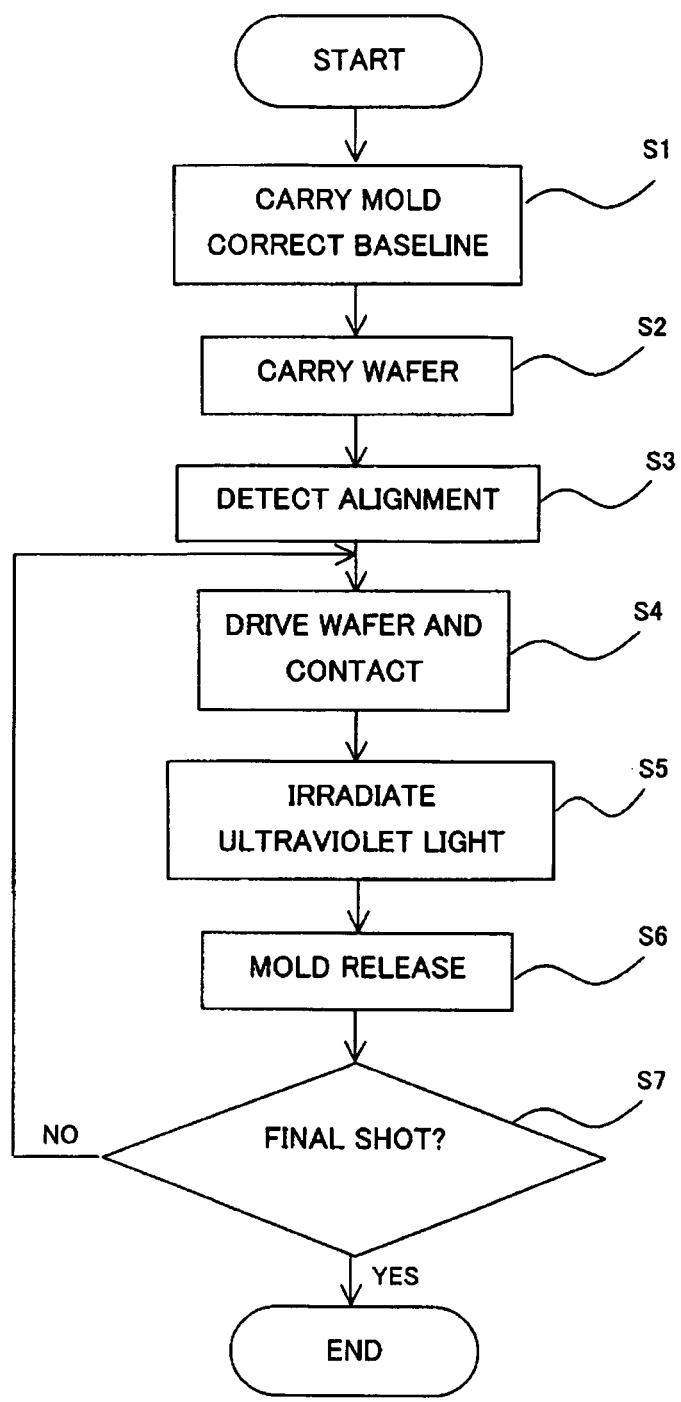
FIG. 2 is a flow chart showing a pattern transfer process with the nanoimprint apparatus of Embodiment 1.

The nanoimprint apparatus formed as described above performs pattern transfer in accordance with steps shown in FIG. 2.

First, the mold 101 is carried into the apparatus by a mold carrying system, not shown, and mounted on the mold chuck 200 (step (abbreviated as "S" in FIG. 2) 1). Then, the attitude of the pattern surface of the mold 101 is measured by a measuring system, not shown. The mold stage 301 is driven to match the position of the mold 101 with an apparatus reference (step 1).

Next, a resist is applied to the wafer 102, and the wafer 102 is carried into the apparatus by a wafer carrying system, not shown (step 2).

Then, the alignment-scope 408 detects the alignment mark on the wafer 102, and the wafer 102 is positioned on the basis of the detection result (step 3).

Next, the wafer stage 402 is driven such that the pattern area of the mold 101 faces a first shot position on the wafer 102 (step 4). The mold driver 302 is driven to push the pattern area of the mold 101 onto the resist on the wafer 102. This causes the resist to flow along the pattern of the mold 101.

With the pattern area of the mold 101 pushed onto the resist, the illumination optical system 304 applies ultraviolet light (a shot is performed) to cure the resist (step 5).

After the resist is cured, the mold driver 302 is again driven to perform mold release for releasing the mold 101 from the resist (step 6). The mold release operation will be described later in detail. In this manner, the resist having the pattern transferred from the mold 101 is left on the wafer 102.

Next, it is determined whether or not the shot at step 5 is the final shot. If it is not the final shot, the flow returns to step 4 to drive the wafer stage 402 such that the mold 101 faces the next shot position on the wafer 101, and the steps 5 and 6 are repeated. A scribe line, later described, is formed between the shot position at which the previous pattern was transferred and the adjacent shot position.

On the other hand, if it is the final shot, the pattern transfer to the wafer 102 is finished. Then, the wafer 102 is taken out by the wafer carrying system. The above mentioned operation control and processing are performed with a control system, not shown. The pattern transfer processing shown in the flow chart is identical to those in other Embodiments, later described.

Figure 3:
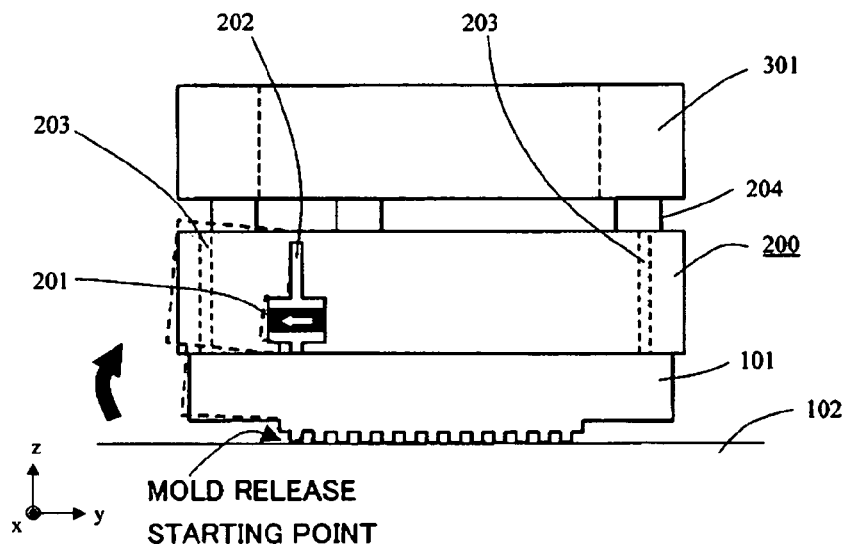
FIG. 3 is a schematic diagram showing the structure of part of the nanoimprint apparatus of Embodiment 1.

Next, the abovementioned mold chuck 200 will be described with reference to FIG. 3. FIG. 3 shows part of the nanoimprint apparatus of Embodiment 1, including the components from the mold stage 301 to the wafer 102.

The mold chuck 200 is fixed to the mold stage 301 through attachments 204. The bottom surface of the mold chuck 200 is a vacuum absorption surface to hold the mold 101 by vacuuming through vacuum absorption paths 203 connected to a vacuum system, not shown.

Reference numeral 202 shows a cutting formed in the mold chuck 200. Reference numeral 201 shows a piezoelectric element actuator in which a piezoelectric element elongates in a direction shown by an arrow in FIG. 3 in response to voltage from a control system, not shown. As a result, the entire mold chuck 200 is bent such that the vacuum attraction surface is warped upward as shown by a dotted line in FIG. 3.

Figure 4:
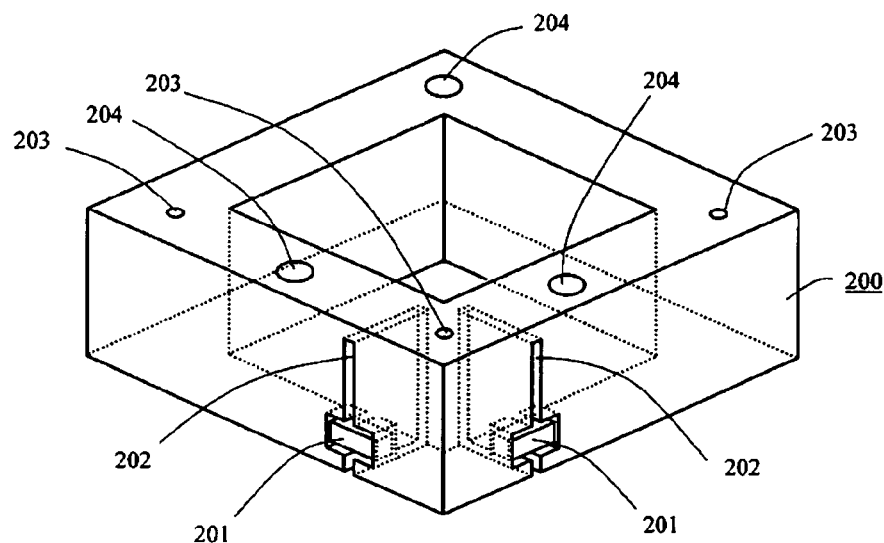
FIG. 4 is a perspective view showing the structure of part of the nanoimprint apparatus of Embodiment 1.

FIG. 4 shows the structure of the mold chuck 200 in more detail. The top surface of the mold chuck 200 faces the mold stage and has three attachments 204 formed therein. The bottom surface of the mold chuck 200 is the vacuum absorption surface for holding the mold 101 and has a groove (not shown) for absorption connected to the vacuum system through the vacuum absorption paths 203. Reference numeral 202 shows a groove provided for deforming the vacuum absorption surface as described above. The piezoelectric element actuator 201 elongates to deform and bend the vacuum absorption surface.

Figure 5:
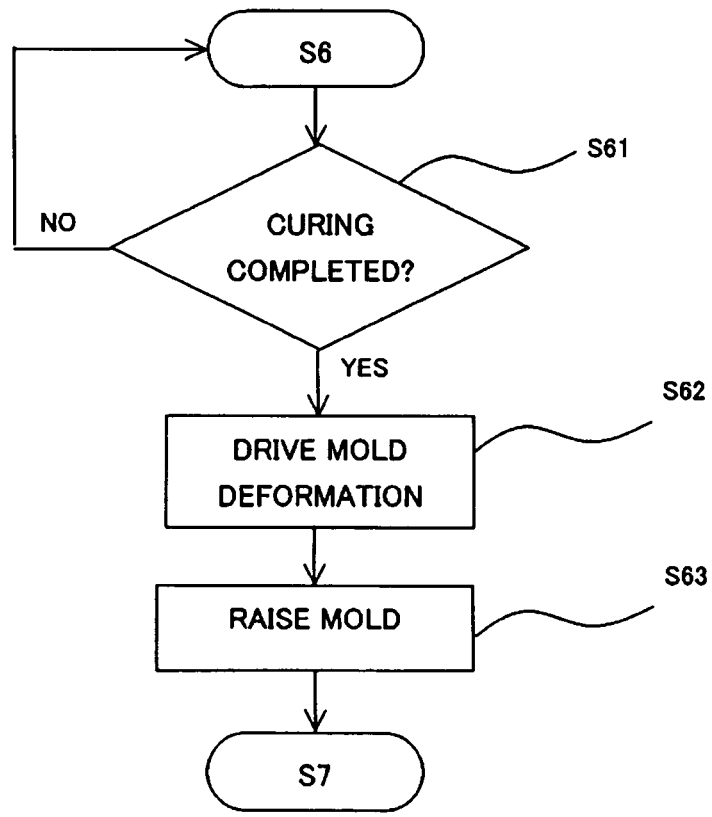
FIG. 5 is a flow chart showing a mold release process with the nanoimprint apparatus of Embodiment 1.

Description will hereinafter be made of the mold release step (step 6) by making use of the mold deformation operation with the mold chuck 200 with reference to FIG. 4 and a flow chart in FIG. 5.

When the mold 101 is pushed onto the resist before curing on the wafer 102 (step 4 in FIG. 2), the vacuum absorption surface of the mold chuck 200 is held flat. Thus, the pattern surface of the mold 101 is pushed onto the resist with the flat state maintained.

After the resist is cured, the control system, not shown, determines whether or not the curing of the resist is completed (step 61). If it is determined that the curing is completed, the flow proceeds to step 62 to drive the piezoelectric element 201. Then, as shown by the dotted line in FIG. 3, the portion of the vacuum absorption surface on one end is warped upward to deform the mold 101 such that the portion thereof adjacent to the pattern area comes away from the resist. Thus, the portion of the small area adjacent to the pattern area at the interface between the resist and the mold is released. The small area serves as a starting point of mold release.

From this state, the mold driver 302 is raised in a Z direction (step 63). The starting point of mold release intentionally formed in the previous step allows the subsequent mold release in the Z direction to be performed smoothly. As a result, the mold release can be achieved quickly without damaging the pattern transferred to the resist.

Figure 6:
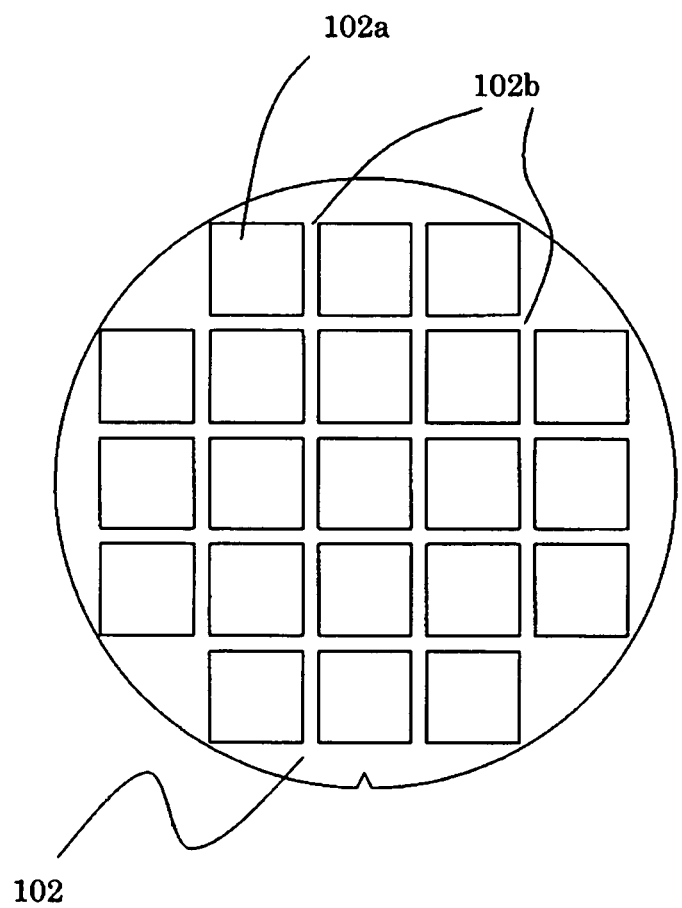
FIG. 6 is a diagram for explaining a scribe line.

The abovementioned starting point of mold release is formed on the scribe line on the wafer (resist) 102. As shown in FIG. 6, when a plurality of patterns 102a are formed on the single wafer 102 in the step and repeat method to manufacture a plurality of devices, a scribe line 102b serves as a margin for cutting into each of the devices. The scribe line 102b is a non-transfer area to which no pattern is transferred. The starting point of mold release formed on the scribe line 102b in this manner can prevent damage to the transferred pattern due to the mold deformation.

(Embodiment 2)

Figure 7:
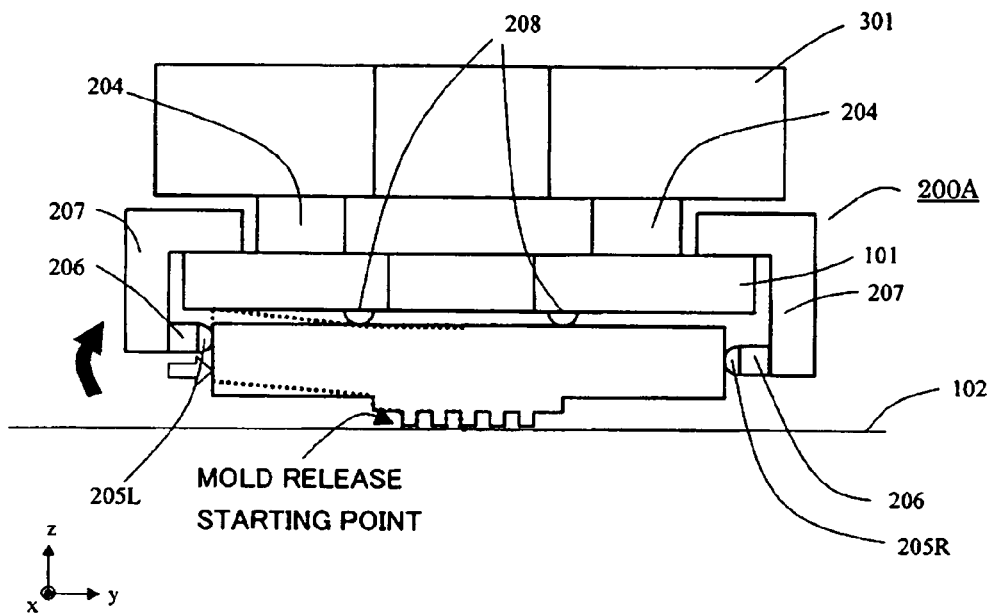
FIG. 7 is a schematic diagram showing the structure of part of a nanoimprint apparatus which is Embodiment 2 of the present invention.

FIG. 7 shows the structure of part of a nanoimprint apparatus which is Embodiment 2 of the present invention, including components from a mold stage 301 to a wafer 102. In Embodiment 2, the components having the same functions as those in Embodiment 1 are designated with the same reference numerals as in Embodiment 1 and description thereof is omitted.

Reference numeral 200A shows a mold chuck of the nanoimprint apparatus. The mold chuck 200A holds a mold 101 and also has the function of forming a starting point of mold release at the time of mold release, as later described. The surface of the mold 101 opposite to a pattern surface (that is, the top surface) serves as a reference plane for positioning.

The top surface of the mold 101 abuts on butt portions 208 provided at three positions in the mold chuck 200A opposite to that top surface, and the mold 101 is sandwiched between indenters 205L and 205R abutting on both sides of the mold 101, thereby retaining (holding) the mold 101 by the mold chuck 200A. Each of the indenters is provided with holding force by an actuator 206 retained by an indenter securer 207.

FIG. 7 shows the indenter 205L abutting on the left side of the mold 101 and the indenter 205R abutting on the right side thereof on the left and the right. While FIG. 7 shows the single indenter 205L and the single indenter 205R, a plurality of indenters 205L and 205R may be formed. The indenter 205L abuts on the left side of the mold 101 at a position higher than the center in the vertical direction on that left side. The indenter 205R abuts on the right side of the mold 101 generally at the center in the vertical direction on that right side.

With the structure, when the holding force of the indenter 205L is increased, the portion of the mold 101 on the left side can be warped upward as shown by a dotted line, in FIG. 7. If the holding force of the indenter 205L is increased and the holding force of the indenter 205R is increased at the same time, the mold 101 can be warped without displacing the entire mold 101.

Description will be made of a mold release step (step 6 in FIG. 2) by using the mold deformation operation with the mold chuck 200A described above with reference to FIG. 7 and the flow chart of FIG. 5.

When the mold 101 is pushed onto the resist before curing on the wafer 102 (step 4 in FIG. 2), the holding force produced by the actuators 206 is maintained at a low level barely enough to retain the mold 101 without dropping. Thus, the pattern surface of the mold 101 is held flat, and the pattern surface of the mold 101 is pushed onto the resist with the flat state maintained.

After the resist is cured, a control system, not shown, determines whether or not the curing of the resist is completed (step 61). If it is determined that the curing is completed, the flow proceeds to step 62 to drive the actuators 206. This increases the holding force of the actuators 206 to deform the mold 101 such that the portion thereof adjacent to the pattern area comes away from the resist as shown by the dotted line in FIG. 7. The portion of the small area adjacent to the pattern area at the interface between the resist and the mold is released. The small area serves as a starting point of mold release.

In that state, a mold driver 302 is raised in a Z direction (step 63). The starting point of mold release intentionally formed in the previous step allows the subsequent mold release in the Z direction to be performed smoothly. As a result, the mold release can be performed quickly without damaging the pattern transferred to the resist.

In Embodiment 2, the starting point of mold release is formed on a scribe line on the wafer (resist) 102 similarly to Embodiment 1. The starting point of mold release formed on the scribe line 102b can prevent damage to the transferred pattern due to the mold deformation.

(Embodiment 3)

Figure 8:
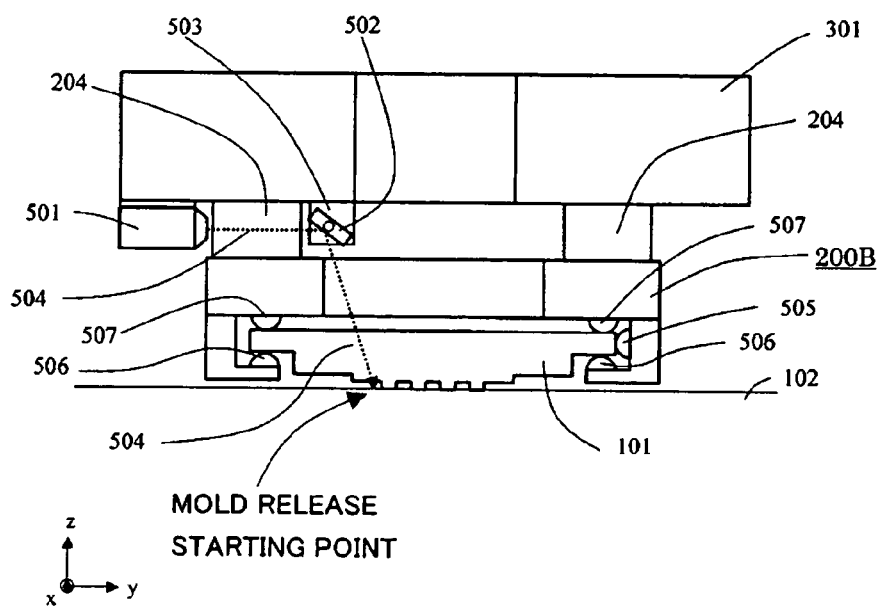
FIG. 8 is a schematic diagram showing the structure of part of a nanoimprint apparatus which is Embodiment 3 of the present invention.

FIG. 8 shows the structure of part of a nanoimprint apparatus which is Embodiment 3 of the present invention, including components from a mold stage 301 to a wafer 102. In Embodiment 3, the components having the same functions as those in Embodiment 1 are designated with the same reference numerals as in Embodiment 1, and description thereof is omitted.

Reference numeral 200B shows a mold chuck. The top surface of the mold 101 abuts on butt portions 507 formed in the mold chuck 200B in a Z direction, and the right surface of the mold 101 abuts on a butt portion 505 in an XY direction, thereby positioning the mold 101 with respect to the apparatus at a predetermined position and a predetermined attitude.

In addition, the mold 101 is held from below at both ends on the left and right by mold securers 506 provided for the mold chuck 200B to retain the mold 101 by the mold chuck 200B.

Reference numeral 501 shows an infrared light source which is fixed to the mold chuck 200B. Reference numeral 502 shows a mirror which reflects an infrared beam 504 emitted from the infrared light source 501 toward the mold 101 and is supported rotatably by the mold chuck 200B. Reference numeral 503 shows a mirror driver which controls the rotation angle of the mirror 502.

The infrared light source 501, the mirror 502, and the mirror driver 503 are placed not to block UV light for resist curing.

Description will be made of a mold release step (step 6 in FIG. 2) by using mold deformation operation with the mold chuck 200B with reference to FIG. 8 and the flow chart of FIG. 5.

When the mold 101 is pushed onto the resist before curing on the wafer 102 (step 4 in FIG. 2), the infrared light source 501 emits no infrared light, and the mold 101 is retained such that its pattern surface is held flat. The pattern surface of the mold 101 is pushed onto the resist with the flat state maintained.

After the resist is cured, a control system, not shown, determines whether or not the curing of the resist is completed (step 61). If it is determined that the curing is completed, the flow proceeds to step 62 to cause the infrared light source 501 to emit the infrared beam 504. The infrared beam 504 emitted from the infrared light source 501 is reflected by the mirror 502, passes through the mold 101, and is applied to a small area adjacent to the pattern area.

The irradiation area of the infrared light can be adjusted with the rotation angle of the mirror 502 controlled by the mirror driver 503. Thus, the infrared light can be applied to a desired position, for example, on a scribe line, if a mold having a pattern area with a different size or position is used.

When the infrared beam 504 is applied locally in this manner, the temperature of the mold 101 in the irradiation area is increased to cause local thermal deformation in the mold 101. At the same time, the portion of the resist in the irradiation area is also thermally deformed. A small amount of displacement occurs at the interface between the mold 101 and the resist due to a difference in coefficient of thermal expansion between the mold 101 and the resist. The displacement serves as a starting point of mold release.

In this state, when the mold 101 is raised in the Z direction (step 63), the mold release is smoothly performed from the starting point of mold release. Consequently, damage to the transferred pattern can be prevented even when the mold release is performed quickly.

When the irradiation area of the infrared light is set on the scribe line, it is possible to avoid damage to the transferred pattern due to the local thermal deformation of the mold caused by the infrared light irradiation.

(Embodiment 4)

Figure 9:
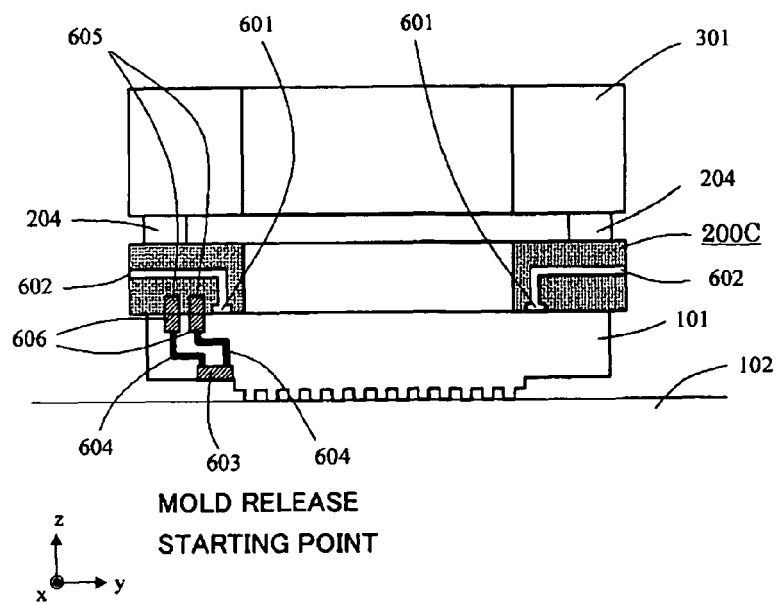
FIG. 9 is a schematic diagram showing the structure of part of a nanoimprint apparatus which is Embodiment 4 of the present invention.

FIG. 9 shows the structure of part of a nanoimprint apparatus which is Embodiment 4 of the present invention, including components from a mold stage 301 to a wafer 102. In Embodiment 4, the components having the same functions as those in Embodiment 1 are designated with the same reference numerals as in Embodiment 1.

In Embodiment 4, similarly to Embodiment 3, the temperature of a mold is locally changed to produce a small amount of displacement at the interface between the mold and a resist. The displacement is used as a starting point of mold release to allow smooth mold release.

Reference numeral 200C shows a mold chuck which is attached to a mold stage 301 through attachments 204. The bottom surface of the mold chuck 200C is a vacuum absorption surface and has vacuum grooves 601 formed therein. Reference numerals 602 shows vacuum channels formed in the mold chuck 200C. The vacuum channels 602 are connected to an evacuation system, not shown, to allow vacuum absorption by the bottom surface of the mold chuck 200C.

Reference numerals 605 show chuck-side electrodes formed in the vacuum absorption surface (the bottom surface) for supplying power to a heater 603, later described. The chuck-side electrodes are connected to a control system, not shown.

The heater 603 is provided as a deforming means in an area adjacent to the pattern area at the bottom of the mold 101. Wirings 604 are disposed in the mold 101 for supplying power to the heater 603. Reference numerals 606 show mold-side electrodes formed in the surface to be absorbed which is the top surface of the mold 101. When the mold 101 is absorbed and held by the mold chuck 200B, the chuck-side electrodes 605 and the mold-side electrodes 606 are electrically connected to each other to allow power supply to the heater 603.

Description will be made of a mold release step (step 6 in FIG. 2) by using mold deformation operation with the mold chuck 200C with reference to FIG. 9 and the flow chart of FIG. 5.

When the mold 101 is pushed onto the resist before curing on the wafer 102 (step 4 in FIG. 2), the heater 603 is not supplied with power, and the mold 101 is retained such that its pattern surface is held flat. The pattern surface of the mold 101 is pushed onto the resist with the flat state maintained.

After the resist is cured, a control system, not shown, determines whether or not the curing of the resist is completed (step 61). If it is determined that the curing is completed, the flow proceeds to step 62 to supply power to the heater 603. The powered heater 603 generates heat which increases the temperature of an area of the mold 101 and thermally deforms that area. At the same time, the portion of the resist affected by the heat is also thermally deformed. A small amount of displacement occurs at the interface between the mold 101 and the resist due to a difference in coefficient of thermal expansion between the mold 101 and the resist. The displacement serves as a starting point of mold release.

In this state, when the mold 101 is raised in a Z direction (step 63), the mold release is smoothly performed from the starting point of mold release. Consequently, damage to the transferred pattern can be prevented even when the mold release is performed quickly.

When the area heated by the heater 603 is set on the scribe line, it is possible to avoid damage to the transferred pattern due to the local thermal deformation of the mold 101.

The heater 603 may be powered for a short time period enough to locally increase the temperature of the mold 101 and then produce the small amount of displacement at the interface between the mold and the resist. The power is supplied only for the short time period in the early stage of the mold release step.

Embodiment 4 has been described in conjunction with the heater 603 which locally increases the temperature of the mold to provide the starting point of mold release. Alternatively, it is possible that a path for a cooling medium (for example, water) is formed at the position where the heater 603 is disposed in the mold 101 in FIG. 9, and the cooling medium is flowed through the path to produce a local temperature reduction.

(Embodiment 5)

Figure 10:
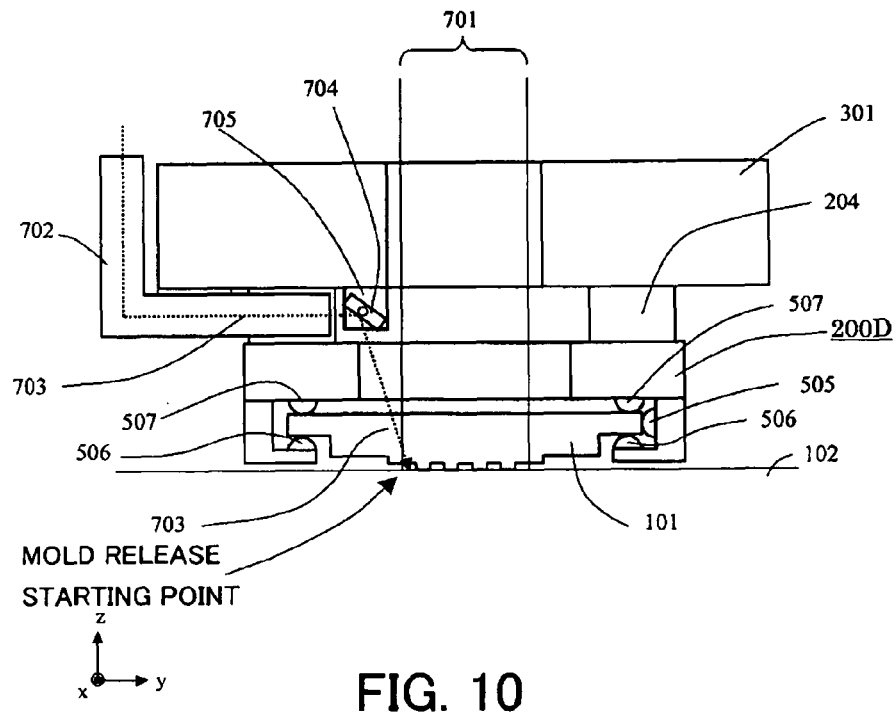
FIG. 10 is a schematic diagram showing the structure of part of a nanoimprint apparatus which is Embodiment 5 of the present invention.

FIG. 10 shows the structure of part of a nanoimprint apparatus which is Embodiment 5 of the present invention, including components from a mold stage 301 to a wafer 102. In Embodiment 5, the components having the same functions as those in Embodiments 1 and 3 are designated with the same reference numerals as in Embodiments 1 and 3.

Embodiments 1 to 4 provide the examples in which the mold 101 is deformed to form the starting point of mold release. In Embodiment 5, a starting point of mold release is formed with another method.

Reference numeral 200D shows a mold chuck which is fixed to a mold stage 301 through an attachment 204. The mold chuck 200D holds the mold 101 in the same manner as in Embodiment 3 described in FIG. 8.

Reference numeral 701 shows illumination light which is ultraviolet light for curing a UV-curing resin. While FIG. 10 shows the illumination light 701 as collimated luminous flux for simplicity, any illumination light may be applied as long as substantially uniform irradiation light intensity is provided over the pattern surface.

Reference numeral 702 shows an optical system which guides ultraviolet light (UV beam) 703 along a different path from that of the illumination light 701 for curing the UV-curing resin from the same light source as that of the illumination light 701. The UV beam 703 emerges from the optical system 702, is reflected by a UV mirror 704, passes through the mold 101, and forms a spot on a resist (wafer surface).

Reference numeral 705 shows a UV mirror driver which controls the rotation angle of the UV mirror 704. Changing the rotation angle of the UV mirror 704 can change the position of the UV beam irradiation area on the wafer surface.

In the nanoimprint apparatus described above, after the mold 101 is pushed onto the resist on the wafer 102, the illumination light 701 for curing the UV-curing resin is applied to the resist. At the same time, the UV beam 703 is applied to the resist through the light guiding system 702 and the UV mirror 704. The spot irradiation area of the UV beam 703 is exposed to a larger amount of light than in the other areas since the UV beam 703 is superposed on the illumination light 701.

Generally, the UV-curing resin is known to contract in volume when it is cured. In addition, when it is cured by intense UV light, it contracts in volume at a higher percentage than when it is cured by UV light at lower intensity applied for a longer time.

In Embodiment 5, the area which receives the spot irradiation of the UV beam 703 is subjected to higher intensity of irradiation than in the other areas which receive only the illumination light 701, so that the portion of the resist which receives the spot irradiation contracts in volume at a higher percentage than in the other portions.

Figure 11A:
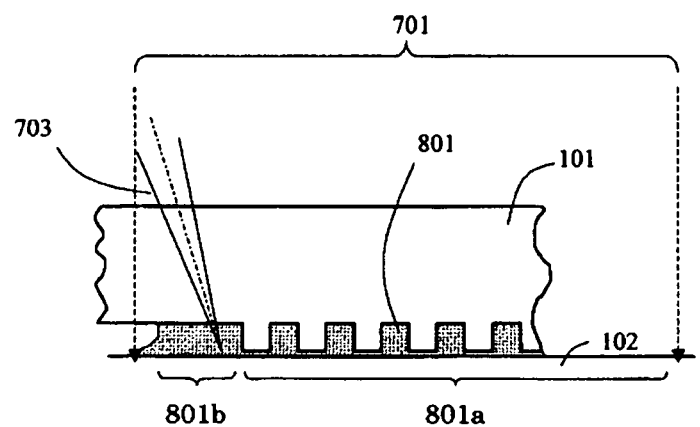
FIGS. 11A and 11B are explanatory diagrams showing the curing of a resist in Embodiment 5.
Figure 11B:
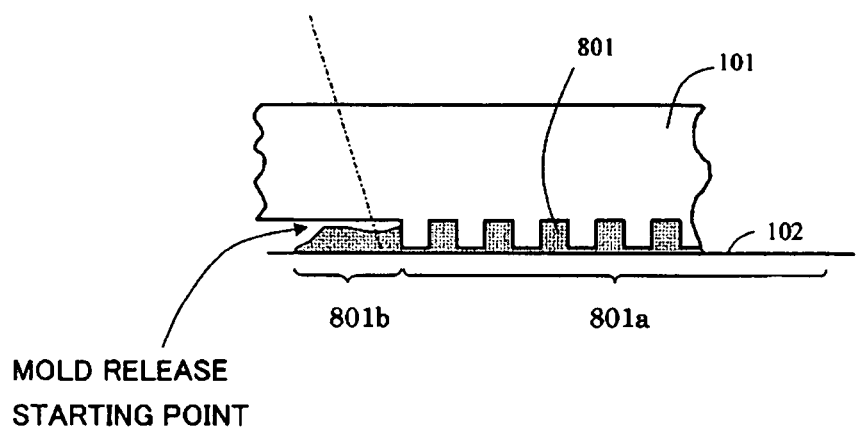

FIGS. 11A and 11B show the volume contraction of the resist. FIG. 11A shows the illumination light 701 for curing applied to the resist. Reference numeral 801 shows the resist covering the surface of the wafer 102. The UV beam 703 is applied to form a spot in a scribe line area 801b adjacent to a pattern transfer area 801a.

FIG. 11B shows the mold and the resist after the curing step is completed. Since the portion of the scribe line area 801b, which was irradiated with the UV beam 703, contracts in volume at a higher percentage than in the pattern transfer area 801a, a gap is formed between that portion and the mold 101. The gap serves as the starting point of mold release.

When the mold 101 is moved away in a Z direction in this state, the mold release is performed smoothly from the starting point of mold release. Since the starting point of mold release is formed on the scribe line, damage to the pattern due to the volume contraction of the resist is prevented.

(Embodiment 6)

Figure 12:
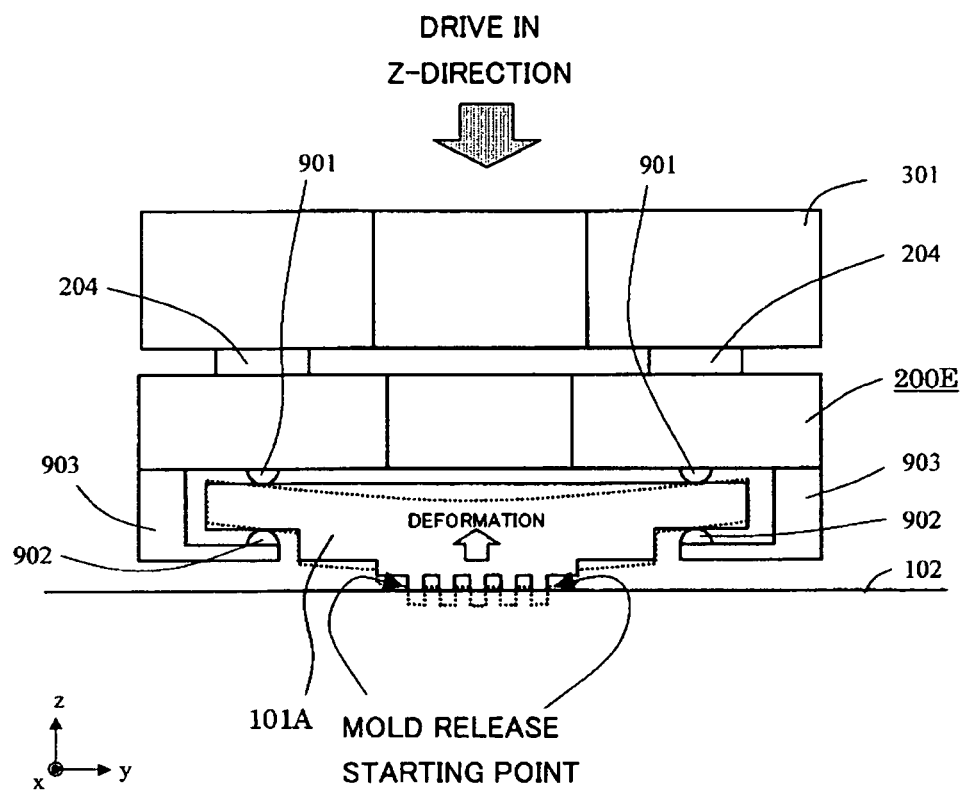
FIG. 12 is a schematic diagram showing the structure of part of a nanoimprint apparatus which is Embodiment 6 of the present invention.

FIG. 12 shows the structure of part of a nanoimprint apparatus which is Embodiment 6 of the present invention, including components from a mold stage 301 to a wafer 102. In Embodiment 6, the components having the same functions as those in Embodiment 1 are designated with the same reference numerals as in Embodiment 1.

In Embodiment 6, a mold 101A is pushed onto a wafer surface (a resist) to cause elastic deformation, and then the mold 101A is raised. The restoration of the mold 101A to the original shape at that point is used for mold release.

The top surface of the mold 101A abuts at its left and right ends on a plurality of butt portions 901 provided for a mold chuck 200E. The peaks of the butt portions 901 are set to be positioned on a predetermined plane. The bottom surface of the mold 101A is supported at the left and right ends by hold portions 902 which are opposed to the butt portions 901 and are provided on a support mechanism 903 extending downward from the mold chuck 200E. In this manner, the mold 101A is retained by the mold chuck 200E.

The mold 101A is held in such a shape that its pattern surface is of convex shape as shown by a dotted line in FIG. 12 before it is pushed onto the wafer surface (in a first state). Next, the mold 101A is driven in a Z direction and the pattern surface is pushed onto the resist on the wafer 102. The mold 101A is elastically deformed by reaction force from the wafer 102, and the pattern surface becomes flat along the wafer surface as shown by a solid line in FIG. 12. In this state, ultraviolet light is applied to cure the resist.

After the resist is cured, the mold 101A is moved up from the wafer surface. As the mold 101A is raised, the mold 101A is gradually changed to the original shape. At this point, the portion of the mold 101A outside the pattern area first comes away from the resist. Specifically, a starting line of mold release is first formed on a scribe line adjacent to the pattern area, and then the mold release line extends toward the inner side of the pattern area from the outside. Thus, the mold release is performed smoothly. The mold release starting line can be formed on the scribe line to prevent damage to the pattern at the start of the mold release.

(Embodiment 7)

Figure 13A:
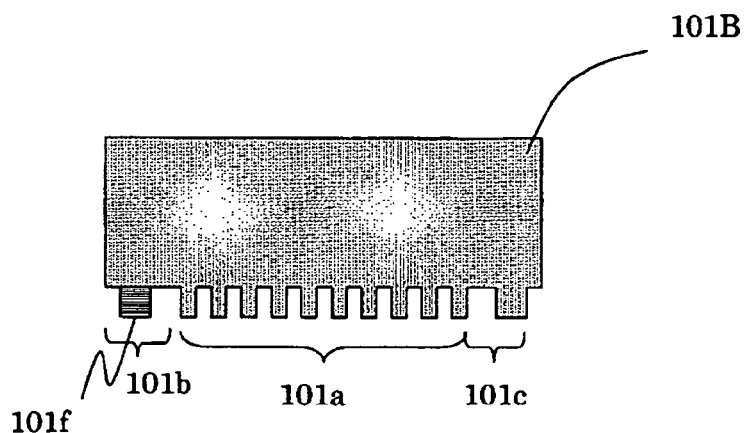
FIGS. 13A and 13B are schematic diagrams showing the structure of part of a nanoimprint apparatus which is Embodiment 7 of the present invention.
Figure 13B:
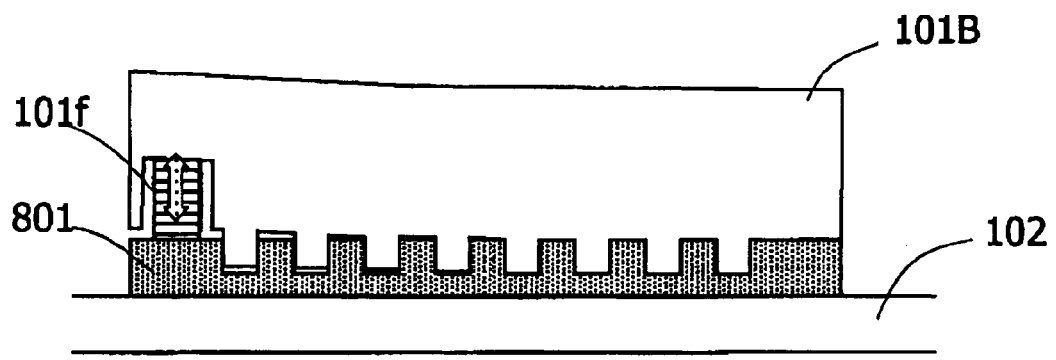

FIGS. 13A and 13B show the structure of part of a nanoimprint apparatus which is Embodiment 7 of the present invention, including components from a mold 101B to a wafer 102. In Embodiment 7, an actuator 101f such as a piezoelectric element and an air cylinder which can elongate in a vertical direction is provided in an area 101b for a scribe line adjacent to a pattern area on the bottom of a mold 101B.

In mold release, the actuator 101f is elongated first. The actuator 101f is elongated while the lower end of the actuator 101f is in contact with a wafer 102 (preferably a portion thereof which is not covered with a resist 801). This causes deformation and upward bending of the portion of the mold 101B in which the actuator 101f is formed. A starting point of mold release can be formed on the scribe line at the interface between the mold 101B and the resist 801.

Then, when the mold 101B is moved away in a Z direction, the mold release is performed smoothly from the mold release starting point. Since the mold release starting point is formed on the scribe line, the pattern is not damaged.

(Embodiment 8)

Figure 14:
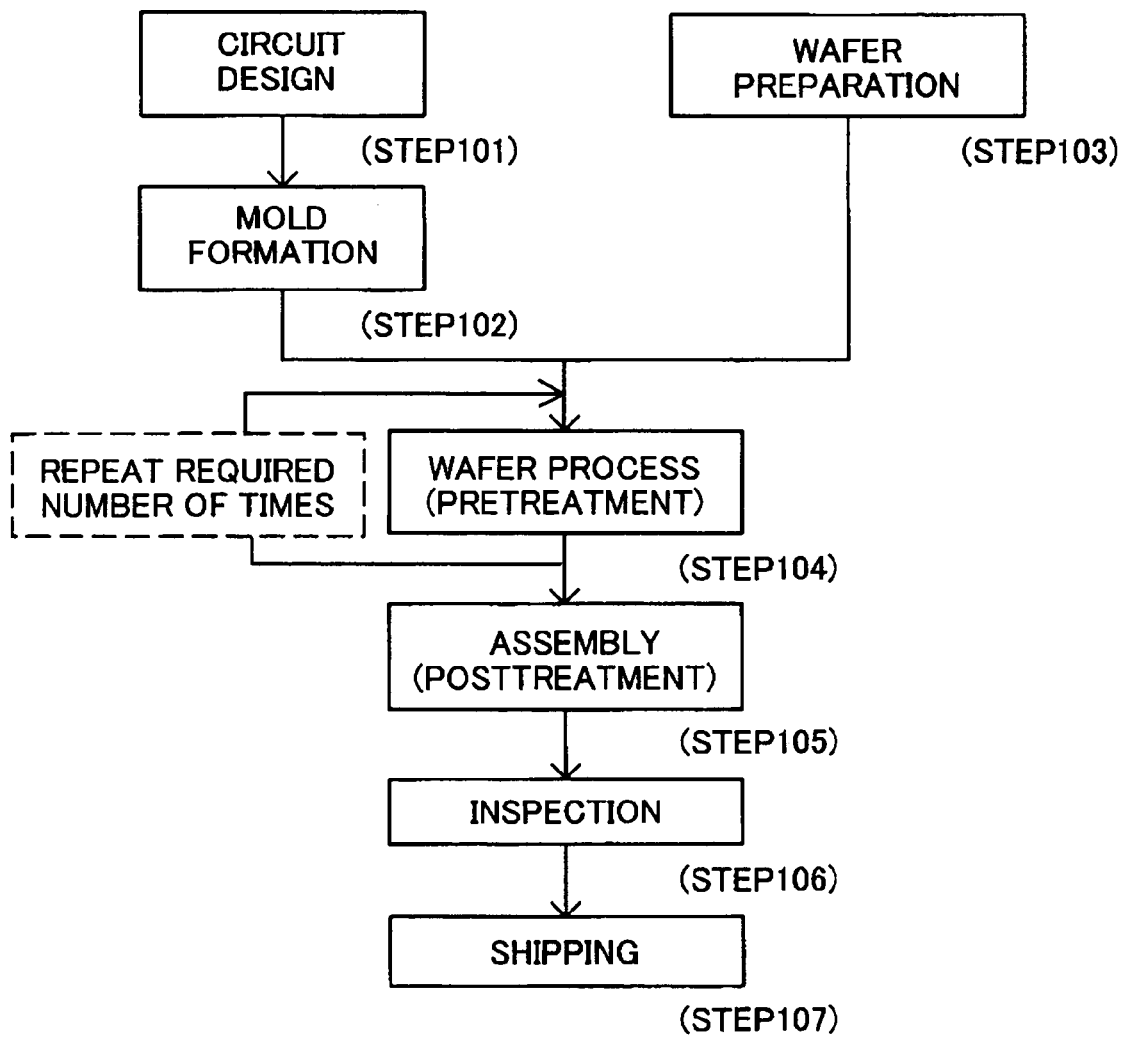
FIG. 14 is a flow chart for explaining a method of manufacturing a device (Embodiment 8) with the nanoimprint apparatus of each of Embodiments 1 to 7.
Figure 15:
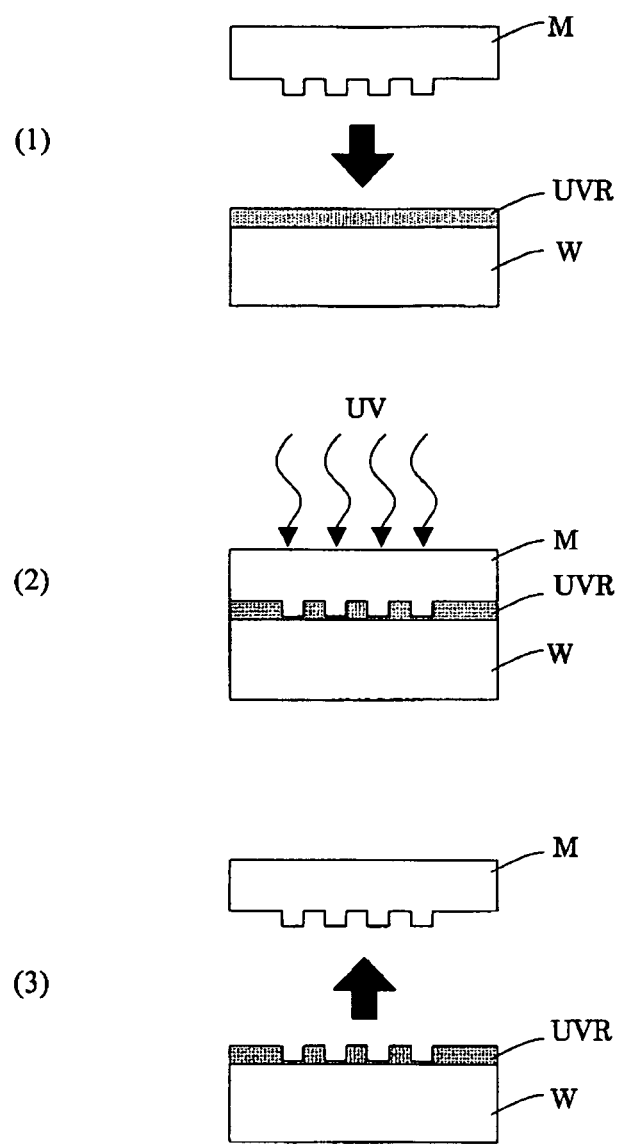
FIGS. 15(1) to 15(3) are diagrams for explaining steps in UV-curing nanoimprint.

Next, description will be made of the process of manufacturing a semiconductor device using the nanoimprint lithography apparatus of each of Embodiments 1 to 7 described above with reference to a flow chart of FIG. 14.

At step 101 (circuit design), the circuit design of the semiconductor device is performed. At step 102 (mold formation), a required number of molds are formed on the basis of the circuit designed at step 101. On the other hand, at step 103 (wafer manufacturing), a wafer is formed by using a material such as silicon.

The next step 104 (wafer process) is called a front-end process in which the abovementioned mold and wafer are used to form a circuit actually on the wafer with the nanoimprint apparatus of each of Embodiments 1to 7. Step 104 is repeated a necessary number of times as required by replacing molds. In some of the repeated operations, a lithography apparatus such as a reduced projection expose apparatus may be used other than the nanoimprint lithography method.

The next step 105 (assembly) is called as a back-end process in which the wafer processed at step 104 is formed into a semiconductor chip. The back-end process includes an assembly step including an assembly substep (dicing and bonding) and a packaging substep (enclosing of a chip).

At the next step 106 (test), the semiconductor device formed at step 105 is inspected in an operation check test, a durability test and the like. The semiconductor device is finished after these steps, and it is shipped at step 107.

The wafer process at step 104 described above has at least one of the following steps: an oxidation step for oxidizing the surface of the wafer, a CVD step for depositing an insulating film on the wafer surface, an electrode forming step for forming an electrode on the wafer with vapor deposition, an ion implantation step for implanting ion into the wafer, a resist processing step for applying a photo-curing resin to the wafer, a transfer step for transferring a circuit pattern to the wafer after it is subjected to the resist processing step with the above mentioned nanoimprint lithography apparatus, an etching step for removing the photo-curing resin (the resist remainder) other than the transferred pattern from the wafer processed at the transfer step, and a resist removal step for removing the unnecessary photo-curing resin. These steps are repeatedly performed to form a multiplicity of circuit patterns on the wafer.

As described above, according to each of Embodiments 1 to 8, the mold release can be performed quickly while damage to the transferred pattern shape associated with the mold release is avoided. This can improve the throughput of nanoimprint lithography processing repeated quickly in the step and repeat method or the like, and even improve the productivity of semiconductor devices or MEMS.

The mold release starting point can be formed on the scribe line adjacent to the pattern transfer area to increase the effective area of the device, thereby enhancing the flexibility in design of the device.

In addition, according to each of Embodiments 1 to 8, the so-called mold release starting point can be purposely formed at the interface between the mold and the object by deforming the mold, providing the light irradiation light intensity in the area where no transfer is performed in the photo-curing resin different from that in the transfer area, or applying the force in the mold release direction by the actuator provided for the mold. Thus, quick mold release can be achieved while damage to the transferred pattern shape is avoided.

Especially, the mold release starting point can be formed on the scribe line to prevent damage to the pattern shape due to the mold deformation for forming the mold release starting point and the contraction of the photo-curing resin.

This application claims a foreign priority benefit based on Japanese Patent Application No. 2005-055096, filed on Feb. 28, 2005, which is hereby incorporated by reference herein in its entirety as if fully set forth herein.

What is claimed is:

1. An imprint apparatus for pressing a mold that has a pattern area with a pattern onto an uncured object on a substrate and curing the pressed uncured object to form a pattern of the cured object on the substrate, the apparatus comprising:
   a substrate stage configured to hold the substrate;
   a mold stage configured to hold the mold and including an actuator, the actuator being configured to apply a force to the mold in contact with the cured object so that an area of the mold adjacent to the pattern area warps relative to the pattern area, as a starting point where a release of the mold from the cured object is started;
   a driving mechanism configured to cause relative movement between the substrate stage and the mold stage in a direction in which the mold is pressed onto the uncured object or the mold is released from the cured object; and
   a controller configured to control the actuator and the driving mechanism so that (i) if the curing is completed, the actuator applies the force to the mold so that the release of the mold is started at the starting point, and (ii) if the curing is completed and the actuator applies the force, the driving mechanism causes the relative movement in the direction in which the mold is released so that a subsequent release of the mold is performed from the starting point to the pattern area.

2. An apparatus according to claim 1, wherein:
   the mold stage includes a chuck configured to chuck the mold, and
   the actuator is configured to apply the force to the mold by applying a force to the chuck to bend the chuck.

3. An apparatus according to claim 2, wherein the actuator includes a piezoelectric element.

4. An apparatus according to claim 3, wherein the chuck has a cutout, and the piezoelectric element is arranged in the cutout to warp the area of the mold adjacent to the pattern area as the starting point.

5. An apparatus according to claim 1, wherein:
the mold stage includes a chuck having an abutting member that abuts on the mold and is configured to chuck the mold via the abutting member, and
the actuator is configured to apply the force to the mold via the abutting member.

6. An apparatus according to claim 5, wherein:
the abutting member comprises two members that abut on a side of the mold and are opposed to each other, and
the two members abut on the side at positions different from each other in the direction in which the mold is pressed onto the uncured objector the mold is released from the cured object.

* * * * *